United States Patent
Poletto et al.

(10) Patent No.: US 12,301,250 B2
(45) Date of Patent: May 13, 2025

(54) ANALOG TO DIGITAL CONVERTER APPARATUS WITH TIME CONTINUOUS INPUT AND CORRESPONDING METHOD

(71) Applicant: STMICROELECTRONICS S.r.l., Agrate Brianza (IT)

(72) Inventors: Vanni Poletto, Milan (IT); Nicola Rogledi, Pavia (IT); Antonio Davide Leone, Siziano (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 121 days.

(21) Appl. No.: 18/069,526

(22) Filed: Dec. 21, 2022

(65) Prior Publication Data

US 2023/0216517 A1    Jul. 6, 2023

(30) Foreign Application Priority Data

Jan. 3, 2022   (IT) .................... 102022000000044

(51) Int. Cl.
    *H03M 1/36*  (2006.01)
    *G01S 7/526*  (2006.01)
    *G01S 15/10*  (2006.01)
    *H03M 1/18*  (2006.01)

(52) U.S. Cl.
    CPC ............. *H03M 1/36* (2013.01); *G01S 7/526* (2013.01); *H03M 1/181* (2013.01); *G01S 15/10* (2013.01)

(58) Field of Classification Search
    CPC ........ H03M 1/36; H03M 1/181; H03M 1/361; H03M 1/367; H03M 1/476; H03M 1/424
    See application file for complete search history.

(56) References Cited

U.S. PATENT DOCUMENTS

| | | | | |
|---|---|---|---|---|
| 5,070,332 A * | 12/1991 | Kaller | ................. | H03M 1/0619 341/156 |
| 6,188,347 B1 * | 2/2001 | Knudsen | ............. | H03M 1/0863 341/160 |
| 6,674,381 B1 * | 1/2004 | Gomez | ................. | H03M 3/328 341/143 |
| 6,697,004 B1 * | 2/2004 | Galton | ................. | H03M 1/066 341/143 |

(Continued)

OTHER PUBLICATIONS

Li et al., "Sigma Delta Modulators Using Semi-uniform Quantizers," *ISCAS the 2001 IEEE International Symposium on Circuits and Systems*, Sydney, Australia, May 6-9, 2001, pp. 456-459.

*Primary Examiner* — Lam T Mai
(74) *Attorney, Agent, or Firm* — Seed IP Law Group LLP

(57) ABSTRACT

Provided is an analog to digital converter configured to receive a continuous input signal. The analog to digital converter includes an integrating block, comprising at least an integrating stage, which output is coupled to a flash analog to digital converter. The analog to digital converter apparatus includes a feedback path coupled to the output of said flash analog to digital converter. The feedback path includes at least a digital to analog conversion block which output is compared at least to the input signal to obtain an error signal which is brought as input to said integrating block. A control block is configured to perform control comprising at least a digital integration, is coupled between the output of said flash analog to digital converter and said feedback path.

17 Claims, 8 Drawing Sheets fig.4

(56) References Cited

U.S. PATENT DOCUMENTS

| | | | |
|---|---|---|---|
| 6,816,100 B1* | 11/2004 | Galton | H03M 1/0682 |
| | | | 341/143 |
| 7,501,965 B2* | 3/2009 | Janakiraman | H03M 1/0809 |
| | | | 341/118 |
| 7,548,178 B2* | 6/2009 | Delano | H03M 3/464 |
| | | | 341/118 |
| 7,564,391 B2* | 7/2009 | Das | H03M 3/42 |
| | | | 341/120 |
| 7,642,943 B1* | 1/2010 | Cetin | H03M 1/007 |
| | | | 323/272 |
| 8,077,066 B2 | 12/2011 | Niwa et al. | |
| 8,963,755 B2 | 2/2015 | Pinna | |
| 9,100,041 B1* | 8/2015 | Richardson | H03M 3/30 |
| 9,462,375 B2* | 10/2016 | Petkov | H04R 3/00 |
| 9,806,730 B1* | 10/2017 | Dusad | H03M 1/08 |
| 10,277,238 B2* | 4/2019 | Nagaraj | H03M 1/34 |
| 10,425,095 B1* | 9/2019 | Price | H03M 1/365 |
| 10,425,096 B1* | 9/2019 | Haessig, Jr. | H03M 1/201 |
| 11,265,008 B2* | 3/2022 | Alhoshany | H03M 3/426 |
| 2002/0186776 A1* | 12/2002 | Cosand | H03M 3/338 |
| | | | 375/247 |
| 2007/0188362 A1* | 8/2007 | Doerrer | H03M 3/338 |
| | | | 341/143 |
| 2008/0186214 A1* | 8/2008 | Janakiraman | H03M 1/0809 |
| | | | 341/110 |
| 2009/0091483 A1* | 4/2009 | Venkataraman | H03M 1/168 |
| | | | 341/172 |
| 2009/0135038 A1* | 5/2009 | Das | H03M 3/42 |
| | | | 341/143 |
| 2012/0194364 A1* | 8/2012 | Chio | H03M 1/145 |
| | | | 341/110 |
| 2013/0207821 A1* | 8/2013 | Sherry | H03M 3/30 |
| | | | 341/143 |
| 2014/0232579 A1* | 8/2014 | Kabir | H03M 1/002 |
| | | | 341/172 |
| 2014/0266828 A1* | 9/2014 | Matsukawa | H03H 7/0138 |
| | | | 333/172 |
| 2014/0340248 A1* | 11/2014 | Trampitsch | H03M 3/39 |
| | | | 341/143 |
| 2015/0263759 A1* | 9/2015 | Marienborg | H03M 3/424 |
| | | | 341/143 |
| 2020/0136633 A1* | 4/2020 | Lee | H03M 1/1014 |

* cited by examiner

ANALOG TO DIGITAL CONVERTER APPARATUS WITH TIME CONTINUOUS INPUT AND CORRESPONDING METHOD

BACKGROUND

Technical Field

Embodiments of the present disclosure relate to techniques for an analog to digital conversion with time continuous input.

Embodiments of the present disclosure relate in particular to ultrasound detectors for obstacle recognition based on time-of-flight evaluation comprising analog to digital converters, in particular in the receiver.

Description of the Related Art

The systems which require an analog to digital conversion with high resolution, show problems of DNL (Differential Non Linearity) and INL (Integral Non Linearity), as well harmonic distortion, aliasing. A big area is required in the chip thus for an antialiasing filter integrated and the problems mentioned also determine low accuracy.

A solution known in the prior art uses a Sigma Delta ADC with time continuous input of the second order and multibit feedback.

In FIG. 1 it is shown instead a block schematization as a loop of a second order sigma delta analog to digital converter apparatus 10, in which an analog input differential signal, in particular an input differential voltage Vdiff, which is time continuous, is brought as input of a difference block (e.g., subtractor) 21, which receives a feedback signal, in particular, a feedback voltage Vfeed, outputting an error voltage Ev. The error voltage Ev is supplied to a first analog integrator 11, implementing an integration function, e.g., 1/s in the Laplace transform representation. The output of such analog integrator 11 is brought as input of a second difference block (e.g., subtractor) 22, which receives also the feedback voltage Vfeed, outputting a second error voltage Ev2. The second error voltage Ev2 is supplied to a second analog integrator 12, which output is supplied to a flash ADC 13, a 10 bit flash ADC in the example. A 10 bit digital output DO of the ADC 13 is fed back as the analog feedback voltage Vfeed, through a DAC 15 to the difference blocks 21, 22. The 10 bit digital output DO of the ADC 13 is also supplied to a digital low pass filter 17 which supplies an output DF with a greater number of bits, e.g., 15 bits. The ADC 13 and the digital low pass filter 17 are clocked by a same clock clk, e.g., 20 MHz.

Target performances which may be reached with this loop are 15 bit resolution, 20 MHz clock, 100 Khz bandwidth In FIG. 2 is shown a more detailed possible implementation of a Sigma Delta ADC 10 after the general schematics of FIG. 1, with a differential structure is shown.

Differential positive and negative input analog voltages Vi+ and Vi−, which together form the differential voltage $V_{diff}$ and which are time continuous, are brought to positive and negative branches inputs of the ADC 10 which include each a resistor R1 in series with the input, in which flows input analog currents i+ and i−. The integrator 11 is implemented by a first differential amplifier with a capacitive feedback, which has its positive and negative inputs coupled to the positive and negative input voltages Vi+ and Vi−, i.e., receiving the input analog currents i+ and i−, through the resistors R1, while its differential outputs are coupled, through second resistors R2 in series, to the corresponding differential inputs of the second integrator 12, also implemented by a differential amplifier with a capacitive feedback. The amplifiers 11 and 12 embody together a two-stage analog amplifier.

Feedback resistors R3 couple the negative output of the second amplifier 12 with the positive input of the first amplifier 11 and the positive output of the second amplifier 12 with the negative input of the first amplifier 11. Both the amplifier 11 and 12 have feedback capacitors, implementing the capacitive feedback, coupling their outputs to their inputs of corresponding polarity, i.e., two capacitors C1 for amplifier 11 and two capacitors C2 for amplifier 12.

The outputs of the second amplifier 12 as coupled to the inputs of corresponding polarity of a flash ADC 13, which is clocked by a clock signal clk, supplying a digital output DO, which is also applied to a DWA (Data Weighted Averaging) Scrambler 14, which shapes the noise in the digital output and which digital output supplies a first DAC 151 and a second digital DAC 152, i.e., the function of DAC 15 is implemented by two parallel DAC, clocked by the clock signal clk, which differential analog outputs, differential currents i1 and i2 respectively, are coupled to the input of opposite polarity of the first differential amplifier 11 and second differential amplifier 12, respectively. In this way the difference blocks 21, 22 are obtained just by the common nodes in which the currents from the resistors R1 and R2 and from the DAC 151 and 152 are injected, which sum currents with opposite polarity. The DAC 151 and 152 perform the multibit feedback in the ADC 10. The ADC 10 samples on the falling edge of the clock signal clk, while the DACs 151, 152 are on during the interval in which the clock signal clk is high. The digital low pass filter 17 is not shown in FIG. 2.

In the ADC of FIG. 1, 2 stages 11 and 12 are both analog, introducing complexity, as well as the two feedback DACs 151 and 152. The flash ADC output bit count is equal to the feedback DAC bit count, which requires and expensive flash ADC in case of high bit count.

The loop of FIGS. 1, 2 has an important drawback that needs to resolve, the number of comparators required by the flash ADC, i.e., for example a 10 bit flash ADC requires 1024 comparators, which occupy a big area on the chip.

BRIEF SUMMARY

As mentioned in the foregoing, the present disclosure provides solutions regarding an analog to digital converter apparatus, adapt to receive a continuous input signal,
  comprising an integrating block, comprising at least an integrating stage, which output is coupled to a flash analog to digital converter,
  said analog to digital converter apparatus comprising a feedback path coupled to the output of said flash analog to digital converter, said feedback path comprising at least a digital to analog conversion block which output is compared at least to the input signal to obtain an error signal which is brought as input to said integrating block,
  wherein a control block configured to perform a control comprising at least a digital integration, is coupled between the output of said flash analog to digital converter and said feedback path.

In variant embodiments, said flash ADC converter has a digital output which quantized values are represented with a given number of bits and said flash ADC converter comprises a number of comparators with respective different thresholds covering the range of the flash ADC converter input signal which is less than two to the power of said number of bits, in particular said given number of bits being 10 and said number of comparators being 17.

In variant embodiments, said flash ADC conversion is configured to implement a conversion characteristic from analog input voltage to digital code output which comprise voltage thresholds for the input voltage which are exponentially spaced.

In variant embodiments, said flash ADC conversion is configured to implement a conversion characteristic from analog input voltage to digital code output where the resolution of the quantized values in the digital code output varies exponentially.

In variant embodiments, said integrating block comprise a first integrating stage and a second integrating stage in series,
said feedback path comprising a digital to analog conversion block comprising a first digital to analog converter, receiving as input said digital output of said flash analog to digital converter, which is compared at least to the input signal to obtain an error signal which is brought as input to said first integrating stage, and second digital to analog converter. receiving as input said digital output of said flash analog to digital converter, which is compared to the output signal of said first integrating stage to obtain a second error signal which is brought as input to said flash analog to digital converter.

In variant embodiments, said control block is configured to perform a proportional and integral control and comprises proportional and integral paths, said proportional path applying a proportional constant, in particular equal to two to the power minus two and said number of comparators being in particular 17.

In variant embodiments, said apparatus it is comprised in an ultrasound detector for obstacle recognition based on time of flight evaluation.

The present disclosure also provides solutions regarding a method performing analog to digital conversion of a continuous input signal,
comprising performing an integration, comprising at least an integrating stage, on which output is performed a flash analog to digital conversion,
feeding back the output of said flash analog to digital conversion performing a digital to analog conversion which output is compared at least to the input signal to obtain an error signal which is brought as input to said integration,
wherein a control is performed, comprising at least a digital integration, on the output of said flash analog to digital conversion, the result of said control being fed to said feedback path.

In variant embodiments, said flash ADC conversion includes providing a digital output with a given number of bits and comprises a number of comparators which is less than then two the power of said number of bits, in particular said given number of bits is 10 and said number of comparators is 17.

In variant embodiments, flash ADC conversion implements a conversion characteristic from analog input voltage to digital code output which comprises voltage thresholds for the input voltage are increasingly exponentially spaced, in particular exponentially spaced.

In variant embodiments, said flash ADC conversion implements a conversion characteristic from analog input signal voltage to digital code output where the resolution of the quantized values in the digital code output increases, in particular exponentially.

In variant embodiments, said control comprises a proportional and integral control on proportional and integral paths, said proportional path applying a proportional constant, in particular equal to two to the power minus two and said number of comparators being in particular 17.

BRIEF DESCRIPTION OF THE SEVERAL VIEWS OF THE DRAWINGS

Embodiments of the present disclosure will now be described with reference to the annexed drawings, which are provided purely by way of non-limiting example and in which.

DETAILED DESCRIPTION

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
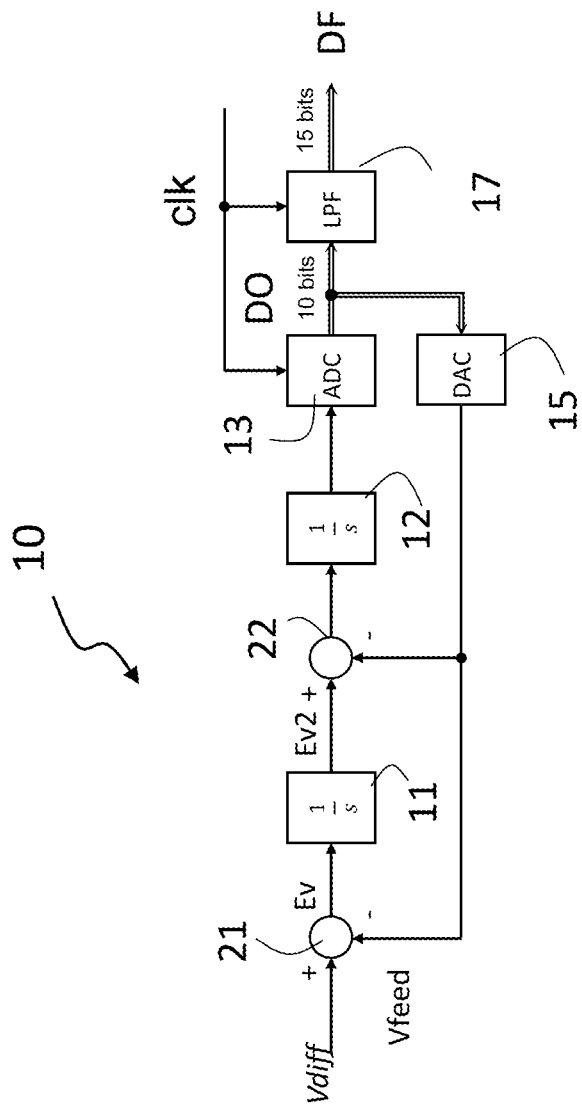
FIG. 1 shows a block diagram of a loop of a second order sigma delta analog to digital converter apparatus.

Figures parts, elements or components which have already been described with reference to FIG. 1, 2 are denoted by the same references previously used in such Figures; the description of such previously described elements will not be repeated in the following in order not to overburden the present detailed description.

Figure 4:
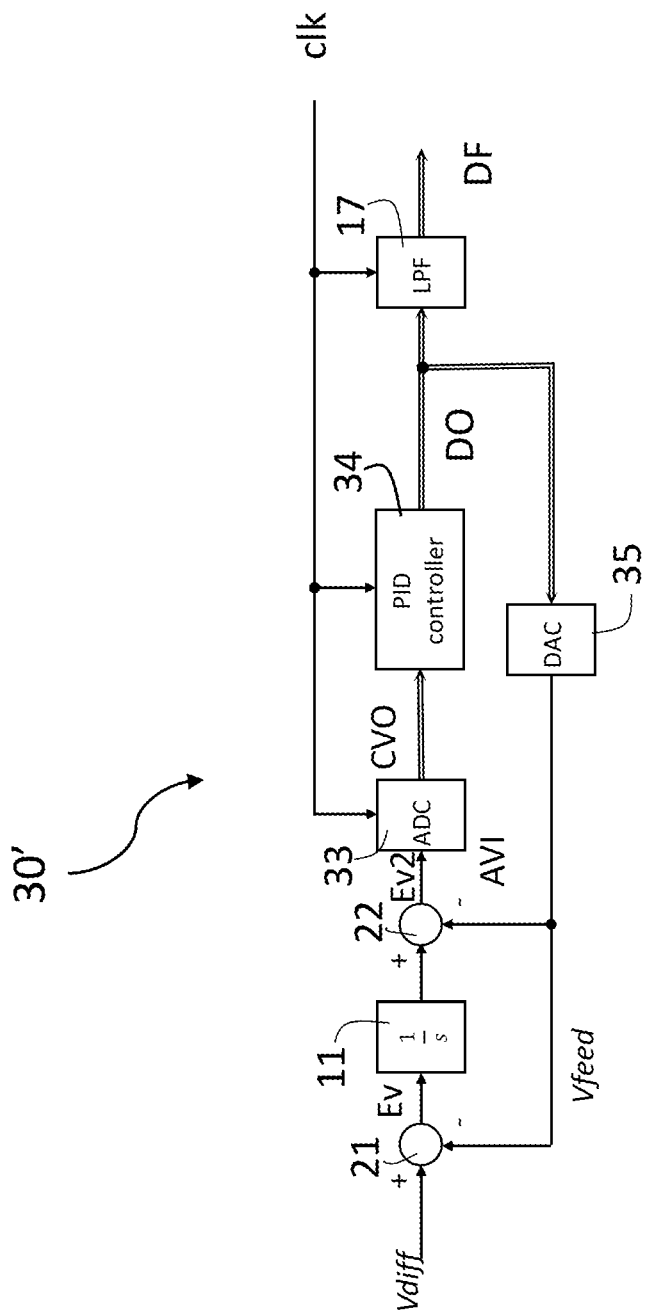
FIG. 4 is a schematic block representation of an apparatus according to embodiments.

As shown in FIG. 4, where the block schematics of a second order sigma delta ADC apparatus 30 according to the solution here described is shown, an input differential voltage Vdiff is brought as input of the difference block 21, which receives a feedback voltage Vfeed, outputting an error voltage Ev. The error voltage Ev is supplied to a first analog integrator 11. The output of the analog integrator 11 is brought as input, converted in a digital signal through a flash ADC 33, of a digital PID block (e.g., controller) 34, instead of the second integrator 12 of FIG. 1 or 2. The 10-bit digital output of the PID 34 is fed back as the analog feedback voltage Vfeed, through a DAC 35. The 10-bit digital output DO of the PID 34 is also supplied to a digital low pass filter 17 which supplies an output with a greater number of bits, e.g., 15 bits. The ADC 33, the PID 34 and the LPF 17 are clocked by a same clock, e.g., 20 MHz.

The flash ADC in general, as known, requires $2^n-1$ comparators for a n bit conversion, which have respective different voltage thresholds, i.e., their outputs commute when the input analog voltage of the flash ADC passes corresponding different threshold (this is usually obtained by introducing a voltage ladder stage before the comparator stage, with a comparator coupled at each rung of the ladder to compare the input voltage to successive reference voltages). Thus, 10 bits means 1023 comparators.

The flash ADC 33, according to an embodiment of the solution here described, has a reduced complexity, using a lesser number of comparators than the two to the number of bits of the output of the flash ADC 33 minus one, in particular in the embodiment shown, only 17 comparators.

The PID block 34 is now detailed. There, it is supplied the output of the flash ADC 33 in parallel to:
- a proportional path comprising a proportional block (e.g., controller) 341 applying, i.e., multiplying by, a proportional constant value KP to the signal in input at the PID block 34, and to
- an integration path, comprising a block (e.g., controller) 342 applying, i.e., multiplying by, an integration constant KI, to the signal in input at the PID block 34, the output of block 342 being then supplied to a digital integrator 343, applying a digital integration function, e.g., $z^{-1}/(1-z^{-1})$. The output of the digital integrator 343 and of the proportional block 341, i.e., of the integral and proportional paths, are summed in a summation block (e.g., adder) 344 to provide the digital output of the PID block 34, which is the digital output DO of the converter 30 (not considering the filtering 17), which is supplied on the feedback path to the DAC converter 15.

In FIG. 4 it is shown a variant embodiment, 30', in which, as in FIG. 1, the integration block (e.g., integrator) 11 is preceded and followed by respective difference blocks 21 and 22. The DAC 35 supplies its output Vfeed to both the difference blocks 21 and 22, the corresponding resulting error Ev and Ev2 driving the integration stage 11 and the ADC 33. As mentioned, this introduces a supplement of phase rotation in the loop which helps the stability (phase in advance more than 45 degrees).

Figure 5:
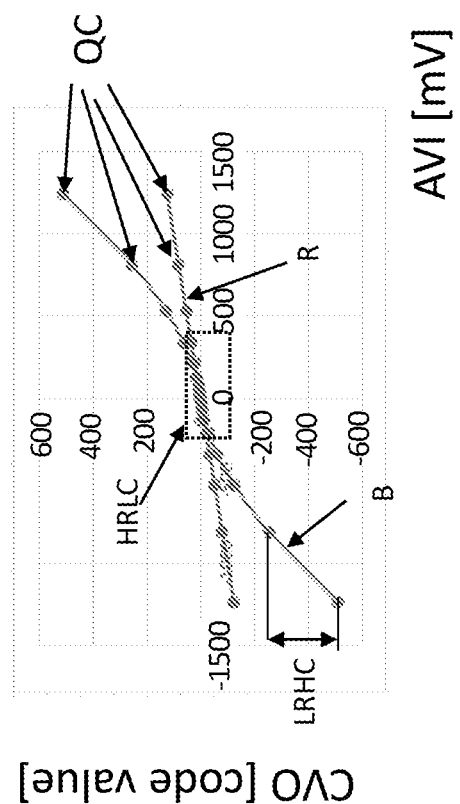
FIG. 5 represents characteristics of a conversion function implemented by a converter in the apparatus of FIG. 3 or 4.

In FIG. 5 it is shown the characteristics of the ADC 33, where the input signal AVI is in mV, while the output CVO is in code values.

There are shown an uncompressed characteristic R and a compressed characteristic B. In both characteristics the abscissa values, input signal values, are more spaced starting from the origin of the axes going toward the positive and negative extremes of the horizontal axis, i.e., the maximum and minimum vale of the input voltage signal AVI. Then in the uncompressed characteristic the quantized codes QC corresponding to the abscissa values follow a linear law. In the compressed characteristic B, where the quantized codes QC values are spaced along the vertical axis, i.e., code values, increasingly spaced going from the origin of the axes toward the positive and negative extremes of the vertical axis, i.e., the maximum and minimum value of the range of the quantized codes QC. The increase of the space between QC values can be exponential or can be embodied by a different increase law. HRLC indicates a region of the compressed characteristic B with low value codes and high resolution, i.e., close on the horizontal axis, which is around the axes origin, and LRHC a region with high value codes and low resolution, at the ends of the horizontal axis. Also in variant embodiments, in a number of point around the origin of the axes characteristics R and B may have the same quantized points QC values, then the increase of the values of characteristics B takes place.

Thus, since such uncompressed characteristics R may not be sufficient to obtain the required number of bits at the output of the ADC 33, in the example 10 bits, the compressed characteristic B with regions LRHC at the ends of the input range, where higher value codes are associated to the same input values and low resolution, may be used. In the compressed characteristic B the regions LRHC can be considered those outside the region HRLC.

Thus the flash ADC converter, 33, includes a number of comparators, each comparing the input signal, AVI, to a respective different threshold, such number of comparators (i.e., thresholds) being less than two to the power of the number of bit requested. This is obtained by implementing a characteristic between the analog input, AVI, and the digital output CVO of the flash ADC converter 33 in which the thresholds of said comparators are spaced or distanced according, by way of example, to an exponential progression, i.e., appear equally distanced on a logarithmic scale, and additionally the quantized code values QC associated to the thresholds have also valued distanced according to by way of example to an exponential progression, i.e., the resolution of the ADC converter is, still by way of example, logarithmic.

In particular, in FIG. 5 the thresholds of the comparators, which are 17, are spaced exponentially, starting from the origin, i.e., zero volt of input signal, along both the positive and negative horizontal axis representing the input voltage (AVI) of the flash ADC 33. Thus the 17 values may be:

+0,643V
+0,416V
+0,264V
+0,163V
+0,095V
+0,050V
+0,020V
0,000V
−0,020V
−0,050V
−0,095V
−0,163V
−0,264V
−0,416V
−0,643V
−0,985V

Figure 3:
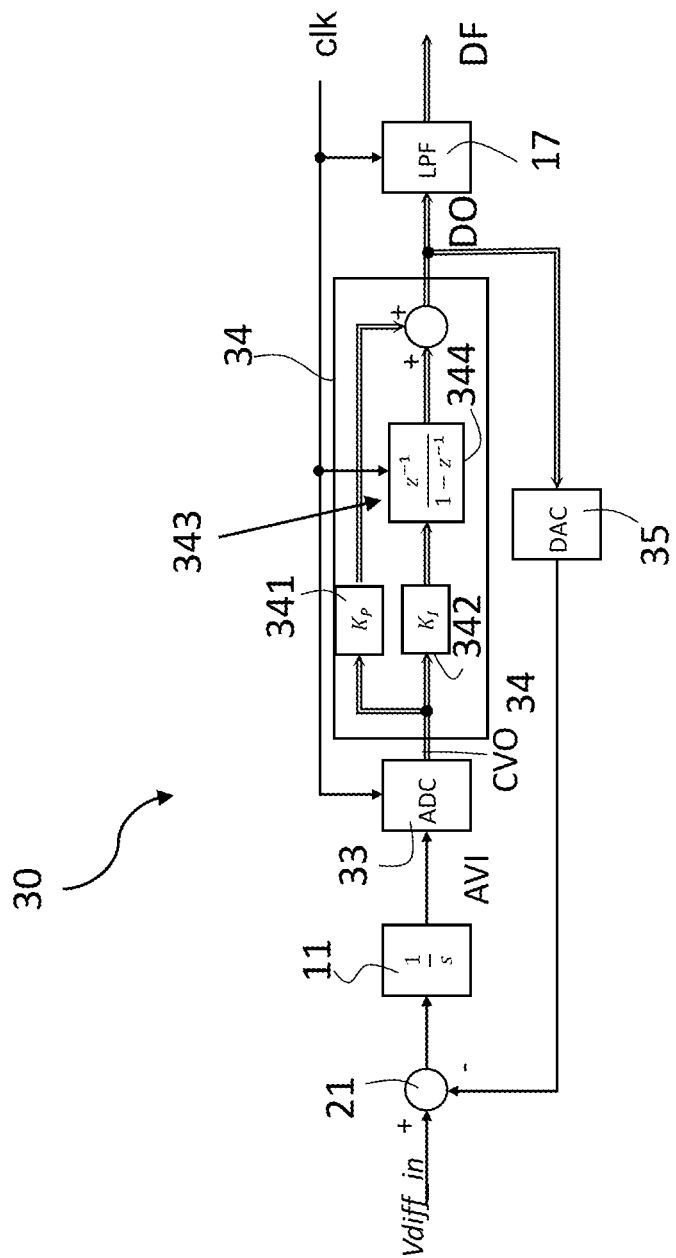
FIG. 3 is a schematic block representation of an apparatus according to embodiments
Figure 6:
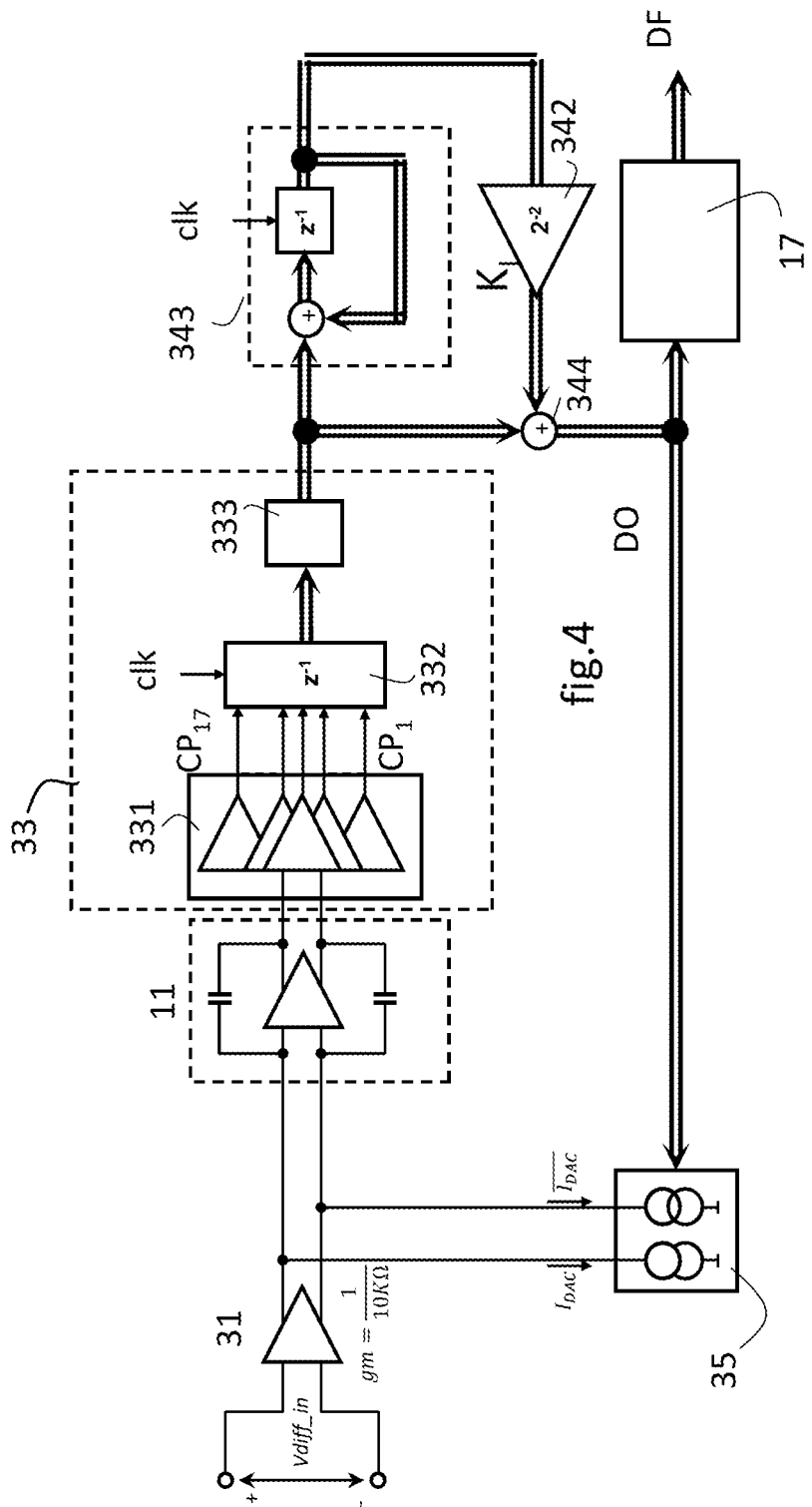
FIG. 6 represents a detailed implementation of the apparatus of FIG. 3.

In FIG. 6 it is shown a more detailed embodiment of a Sigma Delta ADC 30 after the general schematics of FIG. 3 which includes a transconductance amplifier 31, in the example gm=1/10kΩ, converting the differential input voltage Vdiff in differential current. The difference block 21 again is obtained by summing the differential current in the respective output nodes with the feedback signal, which is represented by differential currents IDAC and $\overline{IDAC}$, positive and negative. The integrator block 11 is carried out by an operational amplifier with feedback capacitors. The ADC 33 is embodied by a logarithmic ADC 331 with 17 comparators, $CP_1 \ldots CP_{17}$, which digital output is supplied to a register 332 applying a $z^{-1}$ delay function, in order to synchronize the output levels of the ADC 33. Its output with 17 bits is supplied to an encoder 333 encoding in a digital signal with 9 bits plus sign, which is supplied to the PID control 34, specifically to a block 343 performing the digital integration and to a summation block 344. The output of the block 343, with 12 bits, is divided by 4 in a multiplier 342 multiplying by the integral value $K_1=2^{-2}$, two to the power minus two (or 0.25 or ¼), and also supplied to the summation block 344. The output of the summation block 344 is fed to the current DAC 35 and to the output, through the low pass digital filter 17, supplying the 15 bit output signal DF. In this case $K_P=1$.

The PI paths of FIGS. 3 and 6 are equivalent considering that the block 342 and 243 of FIGS. 3 and 6 remain in series in both embodiments, just inverting positions, which does not change their combined result as they are linear. Also block $K_P$ of FIG. 3 in FIG. 6 is not shown as $K_P=1$.

Figure 2:
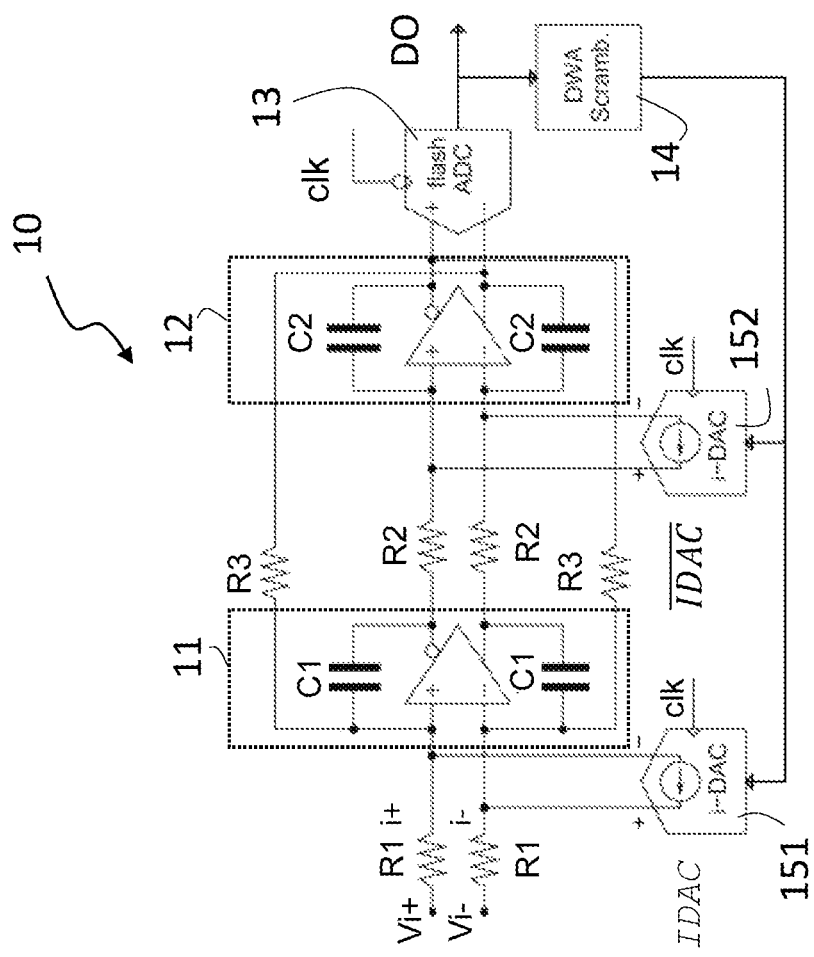
FIG. 2 shows a sigma delta analog to digital converter.
Figure 7:
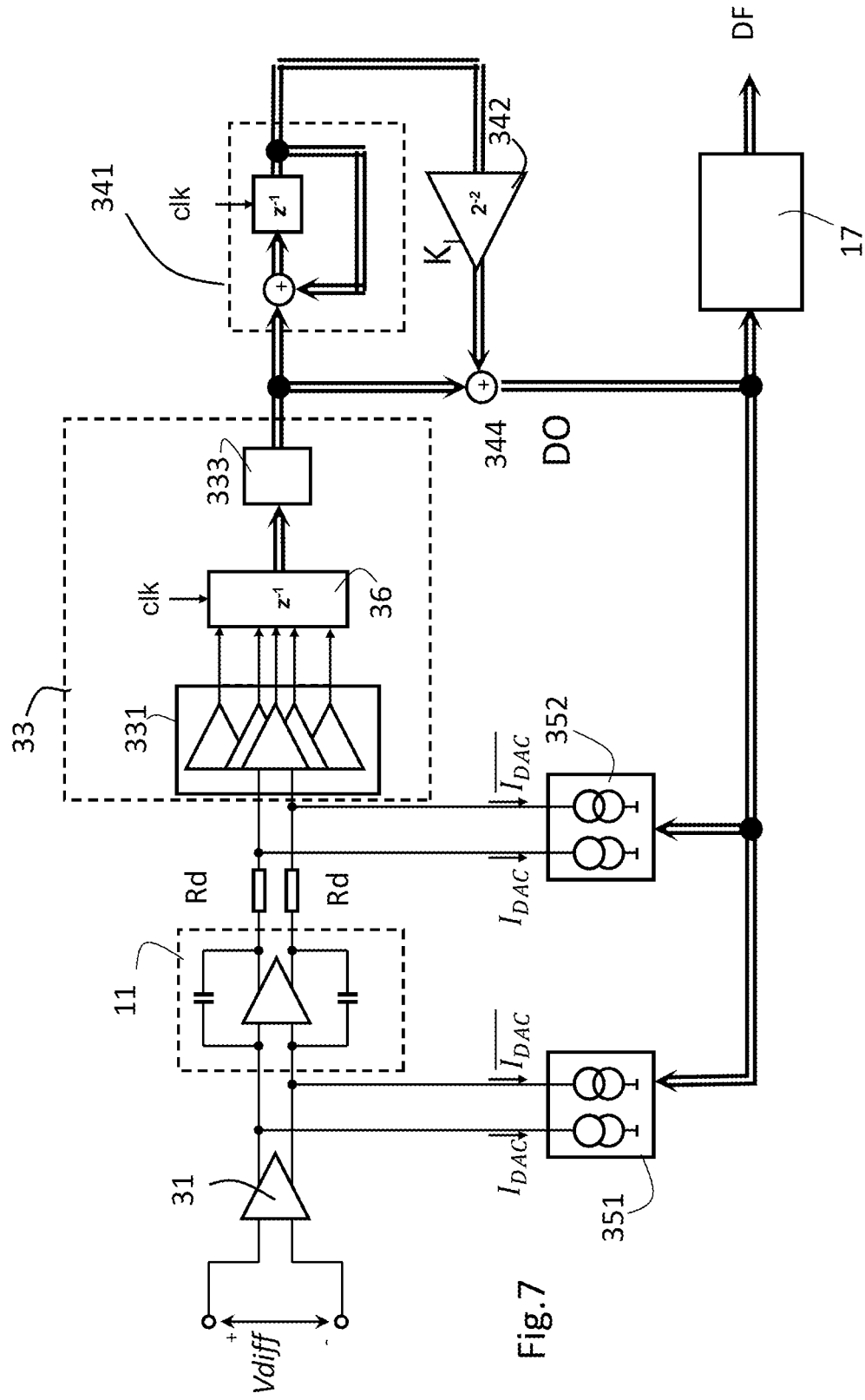
FIG. 7 represents a detailed implementation of the apparatus of FIG. 3.

In FIG. 7 it is shown an embodiment in which, as shown in FIG. 2, there are two DAC 351 and 352, which receive the digital output DO as input and output respective currents IDAC and $\overline{IDAC}$, coupled, in the manner shown for FIG. 2, i.e., to the opposite polarity inputs of the first amplifier 31 and of the ADC 33. This introduces some more phase rotation which helps stability. As shown, the proportional gain Kp is intended as unitary gain, Kp=1.

Decoupling resistor Rd are indicated between the analog integrator 11 and the ADC 33, in particular of the comparators 331.

Therefore in general the solution here described is directed to an analog to digital converter apparatus, adapt to receive a continuous input signal, in particular differential, such as differential input voltages Vi+, V− or the corresponding input currents i+, i− inputting the control loop.

comprising an integrating block comprising at least an integrating stage, e.g., 11, which output is coupled to a flash analog to digital converter 33. As shown in variant embodiments the integrating block may include two integrators in series (as well two difference blocks, to perform the comparison, in particular the difference of the input and feedback signals, obtaining the error signals).

Then, such analog to digital converter apparatus comprises a feedback path coupled to the output DO of said flash analog to digital converter 33, said feedback path comprising at least a digital to analog conversion block (e.g., digital to analog converter), 35 or 351, 352, which output feedback signal, e.g., Vfeed, or the currents IDAC and $\overline{IDAC}$, is compared, by the aforementioned difference blocks 21, or 21, 22, at least to such continuous input signal to obtain an error signal Ev or Ev2, which is brought as input to said integrating block 11, or 11, 33, wherein a control block, e.g., 34, configured to perform a control comprising at least a digital integration 343, is coupled between the output of said flash analog to digital converter 33 and said feedback path.

According to a relevant aspect of the solution here described the flash ADC converter, 33, includes a number of comparators, each comparing the input signal, current or voltage, to a respective different threshold, which is less than two to the power of the number of bit requested. This is obtained by implementing a characteristic between the analog input and the digital output of the flash ADC converter in which the thresholds of said comparators are distanced according to, by way of example, an exponential progression, i.e., appear equally distanced on, still by way of example, a logarithmic scale, and additionally the quantized code values QC associated to the thresholds have also values distanced according, in the example, to an exponential progression.

Figure 8A:
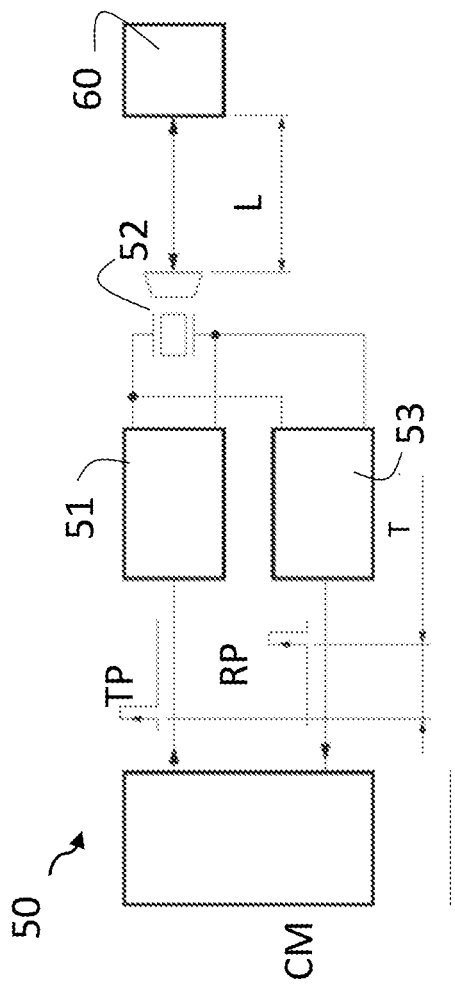
FIGS. 8A and 8B represent schematically an ultrasound detection system and receiver comprising the apparatus according to embodiments.

In FIG. 8A it is shown an ultrasound detector of obstacles 50, comprising a pulse transmitter 51, which drives a piezoelectric transducer 52, which is an ultrasound transceiver, under the control of transmit control pulses TP issued by a control circuit CM, to emit ultrasound pulses, i.e., pressure wave pulses.

An object 60 at a distance L reflects the ultrasound waves associated to the ultrasound pulse, which are detected by the piezoelectric transducer 52 itself, which output is sent to a receiving circuit 53, which issues a receive control pulse RP to the control circuit CM, which measures the time difference T between the transmit control pulse TP and the receive control pulse RP. The time difference T is also known as time of flight and knowing the propagation speed of the ultrasound pulse the distance L can be determined.

Figure 8B:
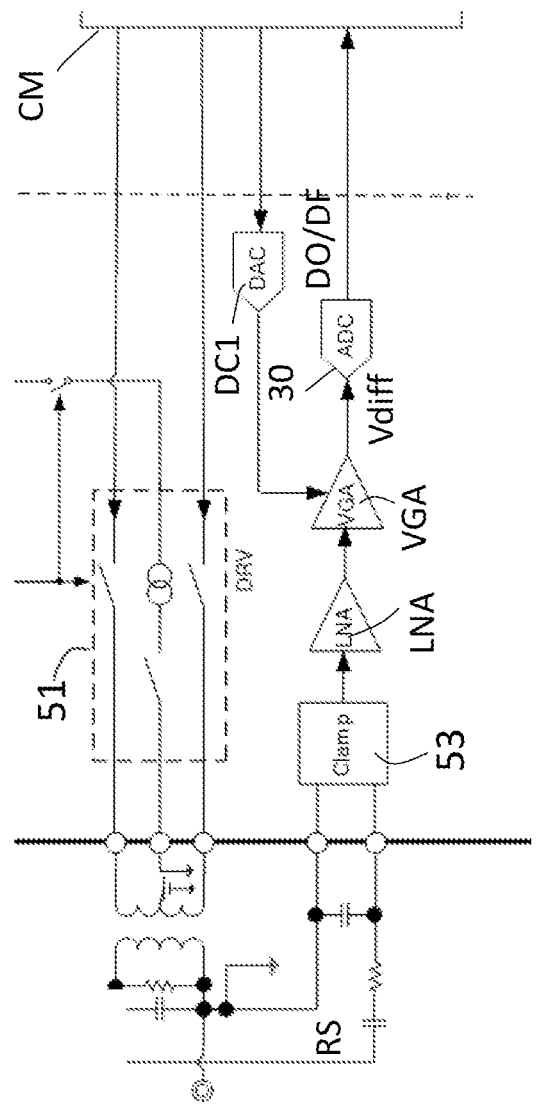

In FIG. 8B it is shown a partial block schematics of the ultrasound detector of obstacles 50 comprising the transducer 52, schematized as a RC parallel pair, which is driven by the pulse transmitter 51, coupled to it by a transformer. The transducer 52 is also is coupled for reception to the ultrasonic sensor receiver 53, which comprises in its turn an ADC converter 30 (in variant embodiments 30').

Thus, in FIG. 8B, an ultrasound received signal RS, which is an analog differential signal, is transmitted by a signal chain comprising a clamp circuit CP, then a low noise amplifier LNA and then a variable gain amplifier VGA, which gain is controlled by the control module CM through a DCA DC1, and which supplies the differential voltage Vdiff to the input of the ADC converter 30. The digital output DO or filtered digital output DF of the ADC converter 30, which in general may comprise the receive control pulse RP, is supplied to a control module CM, which, as mentioned, is configured to perform the computation of the distance L from the object on the basis of the time of flight of T the ultrasound pulse between the transmitter 51 and receiver 53.

Thus, the advantages of the solution described hereabove are clear.

The solution described allows to remove the antialiasing filter and to use a flash ADC comparator with a lesser number of comparators by an arrangement which inserts a proportional integral control in the loop after the flash ADC.

This allows to have more quantization points around the zero, as the 1/s integrator upstream the flash ADC as output around the zero, thus diminishing the number of comparators, by a characteristic of the flash ADC which is compressed.

In general, area on the chip is saved by this solution

In particular a solution is here described, which reaches the same target performances of the prior art solutions, i.e., 15 bit resolution, 20 MHz clock, 100 Khz bandwidth, overcoming the problem involved by a 10 bit flash ADC, by using a simplified ADC which requires a reduced number of comparators.

In such solution the PID has a wide DC gain, the flash ADC operates mainly around zero output level, the flash ADC operates at wide output level only during fast transients, the ADC requires high resolution around zero output level, the ADC has reduced complexity because its resolution is low for wide output levels, the ADC resolution can be for example uncompressed logarithmic (curve R in FIG. 5), the ADC resolution can be for example compressed logarithmic (curve B in FIG. 5).

Of course, without prejudice to the principle of the disclosure, the details of construction and the embodiments may vary widely with respect to what has been described and illustrated herein purely by way of example, without thereby departing from the scope of the present disclosure, as defined by the ensuing claims.

An analog to digital converter apparatus, adapt to receive a continuous input signal (Vdiff; Vi+, V−, i+, i−), may be summarized as including an integrating block (11; 11, 12), including at least an integrating stage, which output is coupled to a flash analog to digital converter (13; 33), said analog to digital converter apparatus including a feedback path (15; 151, 152; 35; 351, 352) coupled to the output of said flash analog to digital converter (13; 33), said feedback path including at least a digital to analog conversion block (15; 151, 152; 35; 351, 352) which output (Vfeed; I1, I2) is compared (21; 21, 22) at least to the input signal (Vdiff; Vi+, V−, i+, i−) to obtain an error signal (Ev; Ev; Ev2) which is brought as input to said integrating block (11; 11, 12), wherein a control block (34) configured to perform a control including at least a digital integration (343), is coupled between the output of said flash analog to digital converter (33) and said feedback path (35; 351, 352).

Said flash ADC converter (33) may have a digital output which quantized values (QC) are represented with a given number (n) of bits and said flash ADC converter (33) may include a number of comparators with respective different thresholds covering the range of the flash ADC converter (33) input signal which is less than two to the power of said number of bits (n) minus one, in particular said given number of bits being 10 and said number of comparators being 17.

Said flash ADC conversion (33) may be configured to implement a conversion characteristic from analog input voltage (AVI) to digital code output (CVO) which may include voltage thresholds for the input voltage (AVI) which are increasingly exponentially spaced, in particular exponentially spaced.

Said flash ADC conversion (33) may be configured to implement a conversion characteristic from analog input voltage (AVI) to digital code output (CVO) where the resolution of the quantized values (QC) in the digital code output (CVO) increases, in particular exponentially.

Said feedback path (351, 352) may include a digital to analog conversion block (351, 352) including a first digital to analog converter (351), receiving as input said digital output of said control block (34), which is compared (21) at least to the input signal (Vdiff; Vi+, V−, i+, i−) to obtain an error signal (Ev) which is brought as input to said integrating stage (11), and a second digital to analog converter (352), receiving as input said digital output of said control block (34), which is compared (22) to the output signal of said first integrating stage (11) to obtain a second error signal (Ev2) which is brought as input to said flash analog to digital converter (13; 33).

Said control block (34) may be configured to perform a proportional and integral control and may include proportional and integral paths, said proportional path applying a proportional constant, in particular equal to two to the power minus two and said number of comparators being in particular 17.

The apparatus may be included in a ultrasound detector (50) for obstacle recognition based on time of flight evaluation.

A method performing analog to digital conversion of a continuous input signal (Vdiff; Vi+, V−, i+, i−), may be summarized as including performing an integration (11; 11, 12), including at least an integrating stage, on which output is performed a flash analog to digital conversion (13; 33), feeding back (15; 151, 152; 35; 351, 352) the output (DO) of said flash analog to digital conversion (13; 33) performing a digital to analog conversion (15; 151, 152; 35; 351, 352) which output (Vfeed; I1, I2) is compared (21; 21, 22) at least to the input signal (Vdiff; Vi+, V−, i+, i−) to obtain an error signal (Ev; Ev; Ev2) which is brought as input to said integration (11; 11, 12), wherein a control (34) is performed, including at least a digital integration (343), on the output of said flash analog to digital conversion (33), the result of said control being fed to said feedback path (35; 351, 352).

Said flash ADC conversion (33) may include providing a digital output with a given number of bits and may include a number of comparators which is less than then two to the power of said number of bits minus one, in particular said given number of bits is 10 and said number of comparators is 17.

Said flash ADC conversion (33) may implement a conversion characteristic from analog input voltage (AVI) to digital code output (CVO) which may include voltage thresholds for the input voltage (AVI) which are exponentially spaced.

Said flash ADC conversion (33) may implement a conversion characteristic from analog input voltage (AVI) to digital code output (CVO) where the resolution of the quantized values (QC) in the digital code output (CVO) varies exponentially.

Said control (34) may include a proportional and integral control on proportional and integral paths, said proportional path applying a proportional constant, in particular equal to two to the power minus two and said number of comparators being in particular 17.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An analog-to-digital converter, comprising:
a flash analog-to-digital converter having an input and an output;
an integrator having an input configured to receive an error signal and an output that is coupled to the input of the flash analog-to-digital converter;
a feedback path including:
a digital-to-analog converter configured to generate an output signal that is compared to an input signal of the analog-to-digital converter to obtain the error signal; and
a controller coupled between the output of the flash analog-to-digital converter and the feedback path and configured to perform digital integration,
wherein the flash analog-to-digital converter generates a digital output having quantized values that are represented by a number of bits, and the flash analog-to-digital converter includes a plurality of comparators having different thresholds, respectively, and the thresholds cover a range of a flash analog-to-digital converter input signal, and the range of the flash analog-to-digital converter input signal is less than two to a power of the number of bits minus one.

2. The analog-to-digital converter according to claim 1, wherein the number of bits is 10 and a number of the plurality of comparators is 17.

3. The analog-to-digital converter according to claim 1, wherein the flash analog-to-digital converter is configured to perform a conversion characteristic from an analog input voltage to a digital code output, and the conversion characteristic includes voltage thresholds for the analog input voltage that are exponentially spaced.

4. The analog-to-digital converter according to claim 1, wherein the flash analog-to-digital converter is configured to perform a conversion characteristic from an analog input voltage to a digital code output, and a resolution of the quantized values in the digital code output increases.

5. The analog-to-digital converter according to claim 4, wherein the resolution of the quantized values in the digital code output increases exponentially.

6. The analog-to-digital converter according to claim 1, the feedback path includes:
a first digital-to-analog converter having an input configured to receive the output signal that is a digital signal; and
a second digital-to-analog converter having input configured to receive the output signal.

7. The analog-to-digital converter according to claim 1, wherein the controller is configured to perform proportional and integral control, and the controller includes an integral path and a proportional path other over which the controller applies a proportional constant.

8. The analog-to-digital converter according to claim 7, wherein the proportional constant is to two to a power of minus two and a number of the plurality of comparators is 17.

9. An ultrasound detector for obstacle recognition based on time of flight evaluation, comprising:
an analog-to-digital converter including:
a flash analog-to-digital converter having an input and an output;
an integrator having an input configured to receive an error signal and an output that is coupled to the input of the flash analog-to-digital converter;
a feedback path including:
a digital-to-analog converter configured to generate an output signal that is compared to an input signal of the analog-to-digital converter to obtain the error signal; and
a controller coupled between the output of the flash analog-to-digital converter and the feedback path and configured to perform digital integration,
wherein the flash analog-to-digital converter generates a digital output having quantized values that are represented by a number of bits, and the flash analog-to-digital converter includes a plurality of comparators having different thresholds, respectively, and the thresholds cover a range of a flash analog-to-digital converter input signal, and the range of the flash analog-to-digital converter input signal is less than two to a power of the number of bits minus one.

10. The ultrasound detector according to claim 9, wherein the number of bits is 10 and a number of the plurality of comparators is 17.

11. The ultrasound detector according to claim 9, wherein the flash analog-to-digital converter is configured to perform a conversion characteristic from an analog input voltage to a digital code output, and the conversion characteristic includes voltage thresholds for the analog input voltage that are exponentially spaced.

12. The ultrasound detector according to claim 9, wherein the flash analog-to-digital converter is configured to perform a conversion characteristic from an analog input voltage to a digital code output, and a resolution of the quantized values in the digital code output increases.

13. The ultrasound detector according to claim 12, wherein the resolution of the quantized values in the digital code output increases exponentially.

14. A method for performing analog-to-digital conversion, comprising:
integrating, by an integrating stage, an error signal to generate a first signal;
performing analog-to-digital conversion, by a flash analog-to-digital converter, on the first signal to generate an output signal;
performing control including digitally integrating the output signal;
feeding back the integrated output signal to a digital-to-analog converter; and
comparing an output of the digital-to-analog converter to a continuous input signal to obtain the error signal,
wherein the flash analog-to-digital converter provides the output signal as a digital output having a number of bits, the flash analog-to-digital converter includes a plurality of comparators having different thresholds, respectively, and the thresholds cover a range of the first signal, and the range is less than two to a power of the number of bits minus one.

15. The method according to claim 14, wherein the flash analog-to-digital converter has a conversion characteristic from analog input voltage to a digital code output that has voltage thresholds for the analog input voltage that are exponentially spaced.

16. The method according to claim 14, wherein the flash analog-to-digital converter has a conversion characteristic from analog input voltage to a digital code output with a resolution of quantized values in the digital code output varying exponentially.

17. The method according to claim 14, wherein performing the control includes:
performing a proportional control on a proportional path and integral control on an integral path, wherein a proportional constant is applied to the proportional path.

* * * * *